United States Patent
Wang et al.

(10) Patent No.: US 7,596,737 B2
(45) Date of Patent: Sep. 29, 2009

(54) SYSTEM AND METHOD FOR TESTING STATE RETENTION CIRCUITS

(75) Inventors: Chung-Hsing Wang, Boashan Township, Hsinchu County (TW); Lee-Chung Lu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 319 days.

(21) Appl. No.: 11/595,143

(22) Filed: Nov. 10, 2006

(65) Prior Publication Data

US 2008/0115024 A1 May 15, 2008

(51) Int. Cl.
*G01R 31/28* (2006.01)
(52) U.S. Cl. ............. 714/733; 714/726; 714/727; 714/728; 714/729; 714/734
(58) Field of Classification Search .............. None
See application file for complete search history.

(56) References Cited

U.S. PATENT DOCUMENTS

| | | | |
|---|---|---|---|
| 6,437,623 B1 * | 8/2002 | Hsu et al. ........... 327/202 |
| 6,744,274 B1 * | 6/2004 | Arnold et al. ....... 326/16 |
| 6,813,739 B1 * | 11/2004 | Grannis, III ....... 714/729 |
| 7,058,834 B2 * | 6/2006 | Woods et al. ....... 713/324 |
| 7,269,780 B2 * | 9/2007 | Arima et al. ....... 714/764 |
| 2002/0162037 A1 * | 10/2002 | Woods et al. ...... 713/322 |
| 2004/0123198 A1 * | 6/2004 | Gschwind ........... 714/726 |
| 2007/0101108 A1 * | 5/2007 | Grossman et al. .... 712/228 |
| 2008/0077816 A1 * | 3/2008 | Ravichandran ...... 713/324 |

* cited by examiner

*Primary Examiner*—John P Trimmings
*Assistant Examiner*—Guerrier Merant
(74) *Attorney, Agent, or Firm*—K&L Gates LLP

(57) ABSTRACT

This invention discloses a system and method for testing a plurality of state retention circuits in an integrated circuit (IC) chip, that comprises a built-in test circuit configured to invoke a clock, a save and a restore signal, and a plurality of serially connected data latches receiving the clock, save and restore signals, wherein each data latch employs one of the plurality of state retention circuits, wherein the plurality of data latches save their existing data in their corresponding state retention circuits upon an assertion of the save signal, restore the data from the plurality of state retention circuits back to their corresponding data latches upon an assertion of the restore signal, and shifting the existing data along the series of the data latches one latch a cycle of the clock signal.

15 Claims, 3 Drawing Sheets

SYSTEM AND METHOD FOR TESTING STATE RETENTION CIRCUITS

BACKGROUND

The present invention relates generally to integrated circuit (IC) design, and, more particularly, to power supply management for IC memory devices.

A need for low power electronics has been driven by portable applications, packing density of ICs and conservation of energy. Particularly in portable applications, one way to reduce power consumption and enhance battery life is to shut off most of the circuits in an IC chip during a sleep mode except those that hold data for subsequent wake-up operations.

FIG. 1 is a schematic diagram illustrating a data latch 100 that preserves data during a sleep mode. The data latch 100 comprises a master and slave latch, 110 and 120, respectively, and a balloon latch 130 coupled to a storage node 115 between the master latch 110 and the slave latch 120. Both the master latch 110 and the slave latch 120 are made of low threshold (Vt) transistors for high speed operation. But a side effect of low Vt is a high leakage current. Besides, since the slave latch 120 need to drive circuits coupled to its DOUT node, its device sizes have to be large to meet its driving requirement. The low Vt and large device sizes all contribute to high leakage current in the master latch 110 and the slave latch 120. In order to reduce power consumption during a sleep mode, power supplies to them are both shut off. During this time, the data stored in node 115 has already been transferred and stored in the balloon latch 130. The balloon latch 130 is made of high Vt devices with moderate sizes, as it only needs to drive the slave latch 120. Power supply to the balloon latch 130 is always on so that the data stored in it may be preserved. Upon the IC chip entering the wake-up mode, a RESTORE signal will let the data stored in the balloon latch 130 be written back into the storage node 115. The balloon latch 130 serves as a state retention circuit for the data latch 100.

FIG. 2 is an implementation of the balloon latch 130 with two cross-coupled inverters 210 and 220 store data at a node 215. A complementary metal-oxide-semiconductor (CMOS) transmission gate 230 along with an inverter 240 controls the access to node 215. When the SAVE signal is asserted to a logic HIGH state, the transmission gate 230 will be on and data at node 115 may be written to node 215, or vice versa.

Since the SAVE and RESTORE signals are generated inside the IC chip, conventional automatic test pattern generation (ATPG) methods cannot access and invoke them, so that the conventional ATPG method cannot test the state retention circuit, i.e., the balloon latch 130. As such, what is needed are a built-in circuit and corresponding testing methodology that invoke the save and restore functions of the state retention circuit and writes in as well as reads out test patterns for testing them.

SUMMARY

This invention discloses a system and method for testing a plurality of state retention circuits in an integrated circuit (IC) chip. According to one aspect of the present invention, the system comprises a built-in test circuit configured to invoke a clock, a save and a restore signal, and a plurality of serially connected data latches receiving the clock, save and restore signals, wherein each data latch employs one of the plurality of state retention circuits, wherein the plurality of data latches save their existing data in their corresponding state retention circuits upon an assertion of the save signal, restore the data from the plurality of state retention circuits back to their corresponding data latches upon an assertion of the restore signal, and shifting the existing data along the series of the data latches one latch a cycle of the clock signal.

According to another aspect of the present invention, the method comprising following sequential steps: shifting a first test pattern into a plurality of serially connected data latches, wherein each data latch employs one of the plurality of state retention circuits, saving the first test pattern in the plurality of data latches to their corresponding state retention circuits, entering a sleep mode, wherein power supplies to the plurality of data latches is shut off while to the plurality of state retention circuits remain, exiting the sleep mode wherein the power supplies are restored, shifting a second test pattern into the plurality of data latches, wherein the second test pattern is complementary to the first test pattern, restoring the first test pattern saved in the plurality of state retention circuits back into the plurality of data latches, obtaining a third test pattern by shifting out the data from the plurality of data latches, and comparing the third test pattern with the first test pattern, wherein if the two test patterns matches, the plurality of state retention circuits passes a test, otherwise it fails.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses system and method for testing state retention circuit in an integrated circuit (IC) chip.

Figure 1:
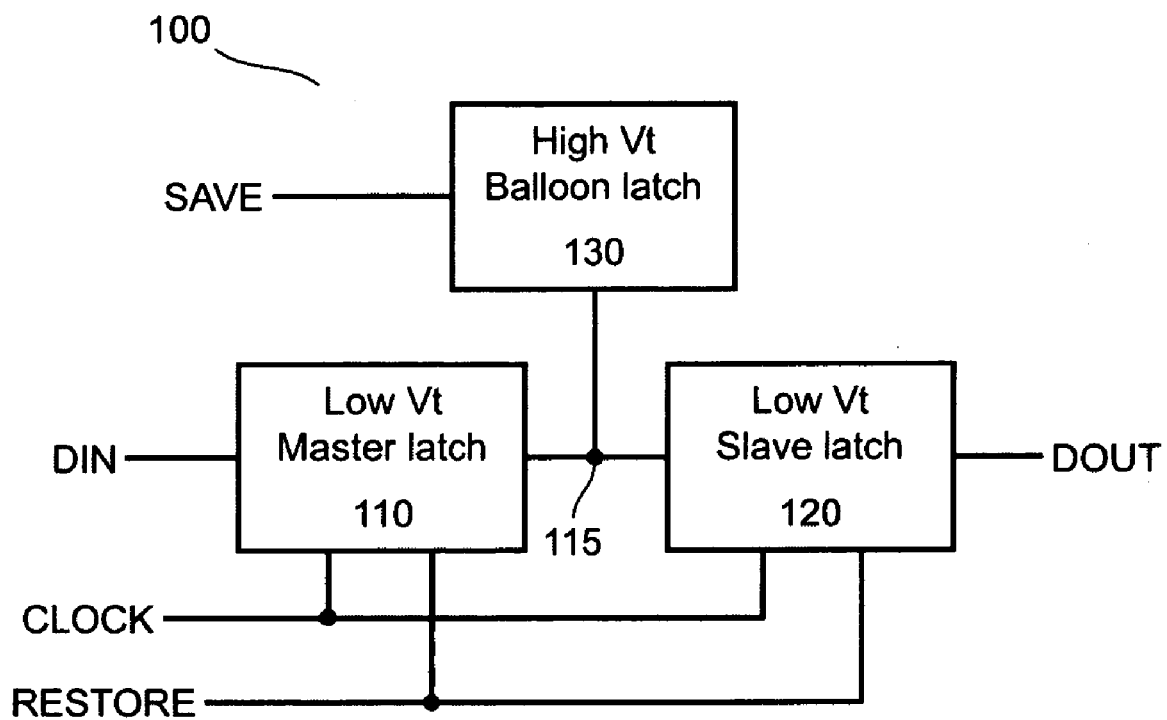
FIG. 1 is a schematic diagram illustrating a data latch that preserves data during a sleep mode.
Figure 2:
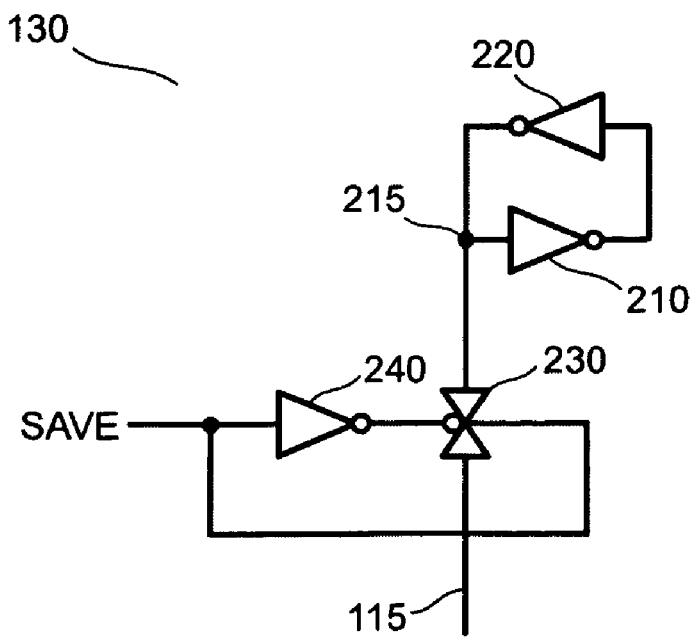
FIG. 2 is an implementation of a balloon latch.

FIGS. 1 and 2 have already been described and discussed as the relevant background to the present invention. They require no further discussion here.

Figure 3:
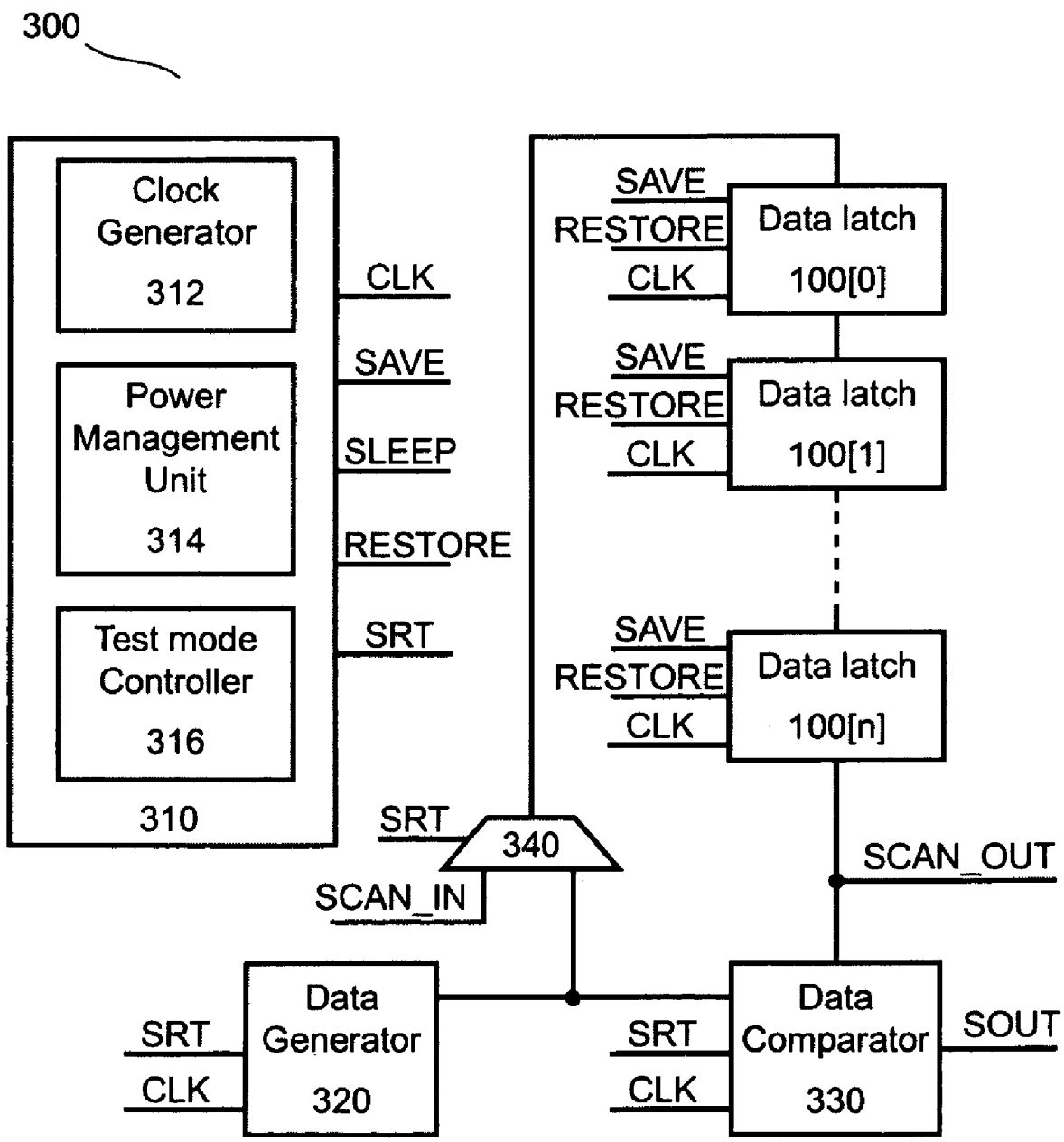
FIG. 3 is a schematic diagram illustrating a state retention circuit testing system according to one embodiment of the present invention.

FIG. 3 is a schematic diagram illustrating a system 300 for testing state retention circuit according to one embodiment of the present invention. The testing system 300 comprises blocks 310, 320, 330 and 334, as well as a plurality of serially connected data latches 110[0:n] under test. The block 310 may be implemented as a signal generator having a clock generator 312, a power management unit 314 and a test mode controller 316, and combined they generate signals CLK, SAVE, SLEEP, RESTORE, SRT. The block 320 may be implemented as a data generator for supplying a series of predetermined data for the testing. The block 330 may be implemented as a data comparator for comparing the data supplied by the data generator 330 with data shifted out from the data latches 110[0:n] during the testing. Comparison results are sent to a test access port (TAP, not shown) for being accessed by a tester outside of the chip. Conventionally, TAP designs follow IEEE standards, and are often designed in the chip for testing other parts of the chip. The state retention testing results are simply added to the inputs of the TAP, and during the state retention testing, the TAP serves as an access port for the state retention testing result.

Referring to FIG. 3, the block 340 may be implemented as a multiplexer for selecting between a SCAN_IN signal and the data supplied by the data generator 320, i.e., a test pattern can either be supplied by an outside tester or be supplied by the data generator 320. In case the test pattern is supplied by the data generator 320, that same test pattern is also passed to the data comparator 330 for being compared with the data shifted out from the data latches 100[0:n]. In case the test pattern is supplied by the outside tester, that test pattern is also stored by the outside tester for comparing with the data shifted out from the data latches 100[0:n]. In this case, the shifted-out data is sent to the TAP directly at node SCAN_OUT without going through the data comparator 330.

Referring to FIG. 3, an output of the multiplexer 340 is coupled to an input of a first data latch 100[0] in the series of latches 100[0:n]. An output of the first latch 100[0] is then coupled to an input of a second latch 100[2], and so on and so forth, until the last latch 100[n] is reached. The CLK signal is a special clock signal for synchronizing and shifting the data latches 100[0:n] during the test mode operation. It may be different from the chip main clock signals. In every CLK cycle data stored in the data latches 100[0:n] shift from top to bottom by one latch, i.e., data in the data latch 100[0] will be shifted to data latch 100[1], data in data latch 100[n-1] data will be shifted to the data latch 100[n], and data in data latch 100[n] will be shifted out to either data comparator 330 or directly to the TAP. Data stored in the data latches 100[0:n] will be shifted out one by one, and after n+1 number of cycles, all of them will be shifted out.

Referring to FIG. 3, upon an assertion of the Save signal, data stored in the data latches 100[0:n] will be written into their corresponding state retention circuit 130 shown in FIG. 1. An asserting of the SLEEP signal switches off power supplies to the main circuits, except the state retention circuit when the chip is about to enter a sleep mode. When the testing system 300 leaving the sleeping mode, an assertion of the RESTORE signal restores the data stored in the state retention latches 130 back to their corresponding data latches. The SRT signal is coupled to the blocks 320, 330 and 340 to control them to response to the test mode. For instance, when the testing system 300 enters the testing mode, The SRT signal is asserted, which will activate the data generator 320 to generate a predetermined test pattern.

Figure 4:
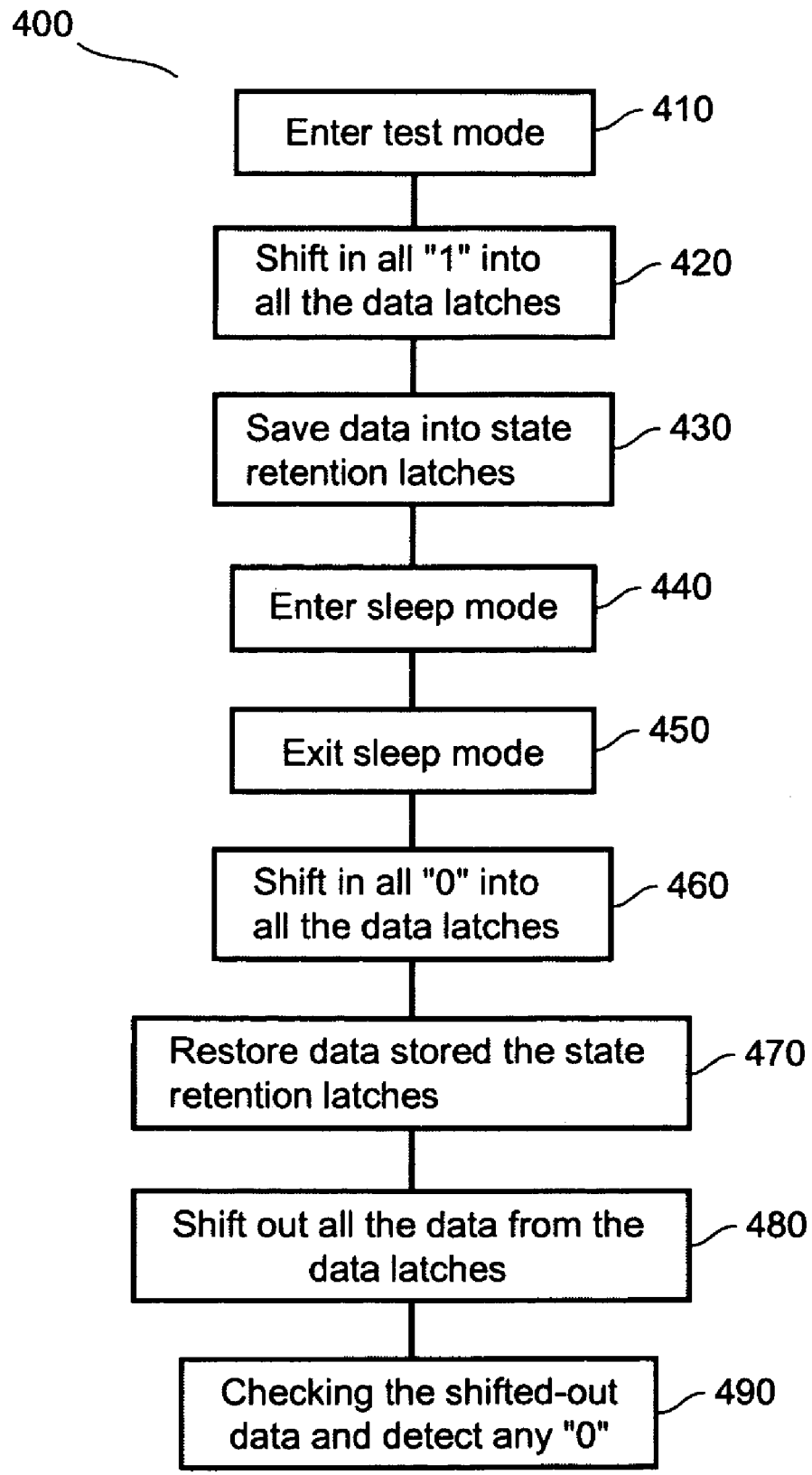
FIG. 4 is a flow chart illustrating a method for testing state retention circuits according to the embodiment of the present invention.

FIG. 4 is a flow chart illustrating a method 400 for testing state retention circuits according to the embodiment of the present invention. Referring to both FIGS. 3 and 4, after entering a test mode in step 410, an outside tester or the data generator 320 shifts a logic HIGH state or "1" into all the data latches 100[0:n] in step 420. Then the SAVE signal is asserted to save the "1" into the state retention latches corresponding to the data latches 100[0:n]. In step 440, the chip enters a sleep mode. Subsequently, it exits the sleep mode in step 450. Then the outside tester or the data generator 320 shifts a logic LOW state or "0" into all the data latches 100[0:n] in step 460. In step 470, the RESTORE signal is asserted to restore the "1" stored in the state retention latches back to their corresponding data latches 100[0:n]. Then the restored data is shifted out in step 480. If any "0" is detected in step 490, then that "0" corresponded state retention latch has failed to store or restore "1".

Although the embodiment uses only all "1" as a test pattern, one having skill in the art would appreciate that other test patterns may also achieve the goal of testing data retention latches. For instance, one case involves first shifting in all "0", and then overwriting it with all "1". In another case, the test pattern may be arbitrary, as long as the overwritten test patter complementary to it, and the outside tester has knowledge about the test pattern.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A system for testing a plurality of state retention circuits in an integrated circuit (IC) chip, the system comprising:
    a signal generator module having a clock generator configured to generate a clock signal, a power management unit configured to invoke a sleep mode in the IC chip, and a test mode controller configured to invoke a save and a restore signal;
    a data generator for supplying a series of predetermined data for the testing;
    a plurality of serially connected data latches receiving the clock, save and restore signals, wherein each data latch employs one of the plurality of state retention circuits;
    and a data comparator for comparing the data supplied by the data generator with data shifted out from the data latches during the testing,
    wherein the plurality of data latches save their existing data in their corresponding state retention circuits upon an assertion of the save signal, restore the data from the plurality of state retention circuits back to their corresponding data latches upon an assertion of the restore signal, and shifting the existing data along the series of the data latches one latch a cycle of the clock signal,
    wherein the data generator is configured to generate a first test pattern and a second test pattern, wherein the second test pattern is complementary to the first test pattern,
    and wherein an output of the data generator is coupled to an input of a first data latch at a first end of the plurality of data latches, and an output of a second data latch at a second end of the plurality of data latches is coupled to an input of the data comparator.

2. The system of claim 1, wherein the signal generator module comprises a power management unit for invoking a sleep mode in the IC chip.

3. The system of claim 1, wherein the data latch comprises a master and a slave latch.

4. The system of claim 1, wherein the state retention circuit comprises a balloon latch and a transmission gate.

5. The system of claim 1 further comprising a multiplexer coupled between the data generator and the input of the first data latch for selecting between the output from the data generator and scanned in data from an outside tester.

6. A system for testing a plurality of state retention circuits in an integrated circuit (IC) chip, the system comprising:
 a signal generator module having a clock generator configured to generate a clock signal, a power management unit configured to invoke a sleep mode in the IC chip, and a test mode controller configured to invoke a save and a restore signal;
 a data generator for supplying a series of predetermined data for the testing;
 a plurality of serially connected data latches receiving the clock, save and restore signals, wherein each data latch employs one of the plurality of state retention circuits;
 a multiplexer coupled between the data generator and the plurality of serially connected data latches for selecting between an output from the data generator and scanned in data from an outside tester; and
 a data comparator for comparing the data supplied by the data generator with data shifted out from the data latch,
 wherein the plurality of data latches save their existing data in their corresponding state retention circuits upon an assertion of the save signal, restore the data from the plurality of state retention circuits back to their corresponding data latches upon an assertion of the restore signal, and shifting the existing data along the series of the data latches one latch a cycle of the clock signal,
 wherein the data generator is configured to generate a first test pattern and a second test pattern, wherein the second test pattern is complementary to the first test pattern,
 and wherein an output of the data generator is coupled to an input of a first data latch at a first end of the plurality of data latches, and an output of a second data latch at a second end of the plurality of data latches is coupled to an input of the data comparator.

7. The system of claim 6, wherein the data latch comprises a master and a slave latch.

8. The system of claim 6, wherein the state retention circuit comprises a balloon latch and a transmission gate.

9. The system of claim 6, wherein the multiplexer is further comprising a multiplexer coupled between the data generator and the input of the first data latch for selecting between the output from the data generator and scanned in data from an outside tester.

10. A method for testing a plurality of state retention circuits in an IC chip including a signal generator module configured to generate signals for testing the state retention circuits, the method comprising following sequential steps:
 shifting a first test pattern into a plurality of serially connected data latches, wherein each data latch employs one of the plurality of state retention circuits;
 saving the first test pattern in response to a save signal invoked by a test mode controller of the signal generator module in the plurality of data latches to their corresponding state retention circuits;
 entering a sleep mode in response to a sleep mode signal generated by a power management unit of the signal generator module, wherein power supplies to the plurality of data latches is shut off while to the plurality of state retention circuits remain;
 exiting the sleep mode wherein the power supplies are restored;
 shifting a second test pattern into the plurality of data latches, wherein the second test pattern is complementary to the first test pattern;
 restoring the first test pattern saved in the plurality of state retention circuits back into the plurality of data latches in response to a restore signal invoked by the test mode controller;
 obtaining a third test pattern by shifting out the data from the plurality of data latches; and
 comparing the third test pattern with the first test pattern, wherein if the two test patterns matches, the plurality of state retention circuits passes a test, otherwise it fails.

11. The method of claim 10, wherein the first test pattern comprises all logic HIGHs and the second test pattern comprises all logic LOWs.

12. The method of claim 10, wherein the first test pattern comprises all logic LOWs and the second test pattern comprises all logic HIGHs.

13. The method of claim 10, wherein the state retention circuit comprises a balloon latch and a transmission gate.

14. The method of claim 10, wherein the first and second test patterns are generated by one or more data generators built in the IC chip.

15. The method of claim 10, wherein the comparing the first test pattern with the third test pattern is implemented in a data comparator built in the IC chip.

* * * * *